(12) United States Patent
Mori et al.

(10) Patent No.: US 12,149,214 B2
(45) Date of Patent: Nov. 19, 2024

(54) VACUUM TUBE FOR AMPLIFIER CIRCUIT, AND AMPLIFIER CIRCUIT USING SAME

(71) Applicant: HAMAMATSU PHOTONICS K.K., Hamamatsu (JP)

(72) Inventors: Hiroshige Mori, Hamamatsu (JP); Yasuaki Maekawa, Hamamatsu (JP); Masayuki Sato, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 733 days.

(21) Appl. No.: 17/283,081

(22) PCT Filed: Aug. 1, 2019

(86) PCT No.: PCT/JP2019/030345
§ 371 (c)(1),
(2) Date: Apr. 6, 2021

(87) PCT Pub. No.: WO2020/079922
PCT Pub. Date: Apr. 23, 2020

(65) Prior Publication Data
US 2021/0384871 A1    Dec. 9, 2021

(30) Foreign Application Priority Data

Oct. 16, 2018   (JP) .................. 2018-195227

(51) Int. Cl.
*H03F 3/02*    (2006.01)
*H01J 19/02*    (2006.01)
*H01J 19/54*    (2006.01)

(52) U.S. Cl.
CPC .............. *H03F 3/02* (2013.01); *H01J 19/02* (2013.01); *H01J 19/54* (2013.01)

(58) Field of Classification Search
CPC .. H01J 19/00; H01J 19/02; H01J 19/28; H01J 19/32; H01J 19/34; H01J 19/38;
(Continued)

(56) References Cited

U.S. PATENT DOCUMENTS 2,063,195 A * 12/1936 Schlesinger ............ H01J 40/14
313/3
2,073,453 A *  3/1937 Nelson ................... H01J 40/16
313/538
(Continued)

FOREIGN PATENT DOCUMENTS

CN        101208768 A    6/2008
FR          840175 A     4/1939
(Continued)

OTHER PUBLICATIONS

International Preliminary Report on Patentability mailed Apr. 29, 2021 for PCT/JP2019/030345.

*Primary Examiner* — John R Lee
(74) *Attorney, Agent, or Firm* — Faegre Drinker Biddle & Reath LLP

(57) ABSTRACT

A vacuum tube for amplifier circuit includes: a light incidence window that transmits signal light; a photoelectric conversion unit that converts the signal light transmitted through the light incidence window into photoelectrons; an output unit that has an anode, on which the photoelectrons are incident, and outputs a signal corresponding to the incident photoelectrons; and a grid electrode that is disposed in a path of the photoelectrons from the photoelectric conversion unit to the anode and controls the amount of photoelectrons incident on the anode.

19 Claims, 13 Drawing Sheets

(58) Field of Classification Search
CPC .. H01J 19/40; H01J 19/54; H01J 21/00; H01J 21/06; H01J 21/10; H01J 1/16; H03F 3/00; H03F 3/02; H03F 3/181
See application file for complete search history.

(56) References Cited

U.S. PATENT DOCUMENTS

| | | | | |
|---|---|---|---|---|
| 2,100,755 | A * | 11/1937 | Shepard, Jr. | G01J 1/42 |
| | | | | 250/214 R |
| 2,234,011 | A * | 3/1941 | Shepard, Jr. | H01J 40/14 |
| | | | | 250/214 R |
| 2,550,648 | A * | 4/1951 | Sweet | G01N 21/5911 |
| | | | | 346/33 A |
| 2,729,767 | A * | 1/1956 | Psoras | B60Q 1/1423 |
| | | | | 315/315 |
| 3,299,343 | A * | 1/1967 | Hickey | G03B 39/005 |
| | | | | 323/318 |
| 3,983,437 | A | 9/1976 | Benson et al. | |
| 4,591,717 | A * | 5/1986 | Scherber | H01J 9/12 |
| | | | | 250/338.4 |
| 5,461,226 | A * | 10/1995 | Nicoli | G01T 1/2957 |
| | | | | 250/336.1 |
| 6,198,221 | B1 * | 3/2001 | Suyama | H01J 43/28 |
| | | | | 313/542 |
| 6,337,537 | B1 * | 1/2002 | Bourgade | H01J 40/16 |
| | | | | 313/542 |
| 7,166,830 | B2 * | 1/2007 | Kitahara | G01J 1/0204 |
| | | | | 250/214 R |
| 11,118,969 | B2 * | 9/2021 | Fukasawa | H01J 40/16 |
| 2007/0131869 | A1 * | 6/2007 | Cole | H01J 47/02 |
| | | | | 250/372 |
| 2021/0384871 | A1 * | 12/2021 | Mori | H01J 19/56 |
| 2023/0369035 | A1 * | 11/2023 | Kodama | H01J 40/02 |

FOREIGN PATENT DOCUMENTS

| | | |
|---|---|---|
| GB | 490265 A | 7/1937 |
| GB | 555478 A | 8/1943 |
| JP | S58-054714 A | 3/1983 |
| JP | H04-245135 A | 9/1992 |
| JP | H09-027265 A | 1/1997 |
| JP | 2002-245961 A | 8/2002 |
| JP | 3854723 B2 | 12/2006 |
| JP | 2007-534138 A | 11/2007 |
| JP | 2011-228760 A | 11/2011 |
| JP | 5405423 B2 | 2/2014 |
| JP | 2018-022709 A | 2/2018 |
| JP | 2018-116946 A | 7/2018 |
| WO | WO-2005/008711 A2 | 1/2005 |

* cited by examiner

VACUUM TUBE FOR AMPLIFIER CIRCUIT, AND AMPLIFIER CIRCUIT USING SAME

TECHNICAL FIELD

One aspect of the present invention relates to a vacuum tube for amplifier circuit and an amplifier circuit using the same.

BACKGROUND ART

Conventionally, vacuum tube for amplifier circuits used in amplifier circuits of audio devices and the like are known (refer to, for example, Patent Literature 1). In the vacuum tube for amplifier circuit described in Patent Literature 1, a filament is adopted as an electron source.

CITATION LIST

Patent Literature

Patent Literature 1: Japanese Unexamined Patent Publication No. 2011-228760

SUMMARY OF INVENTION

Technical Problem

Here, a vacuum tube for amplifier circuit in which a filament, which is a thermionic source, is adopted as an electron source tends to generate heat, which may adversely affect surrounding circuit elements and the like. Therefore, it is difficult to make the amplifier circuit using the vacuum tube small.

One aspect of the present invention has been made in view of the above circumstances, and an object of the present invention is to provide a vacuum tube for amplifier circuit capable of suppressing heat generation and realizing a small amplifier circuit.

Solution to Problem

A vacuum tube for amplifier circuit according to one aspect of the present invention includes: an incidence window portion that transmits signal light; a photoelectric conversion unit that converts the signal light transmitted through the incidence window portion into photoelectrons; an output unit that has an anode, on which the photoelectrons are incident, and outputs a signal corresponding to the incident photoelectrons; and a grid electrode that is disposed in a path of the photoelectrons from the photoelectric conversion unit to the anode and controls an amount of the photoelectrons incident on the anode.

In the vacuum tube for amplifier circuit according to one aspect of the present invention, the signal light is converted into photoelectrons by the photoelectric conversion unit, and the signal corresponding to the photoelectrons is output from the output unit. Then, in the vacuum tube for amplifier circuit, the amount of photoelectrons incident on the anode of the output unit is controlled by the grid electrode. Therefore, the signal output from the output unit can be obtained by controlling the photoelectrons from the photoelectric conversion unit with the grid electrode. In such a configuration, since the output signal can be obtained without adopting a thermionic source as an electron source, it is possible to suppress heat generation and realize a small amplifier circuit.

A separation distance between a photoelectric surface of the photoelectric conversion unit and the grid electrode may be shorter than a separation distance between the grid electrode and the anode. Thus, since the separation distance between the photoelectric surface and the grid electrode is short, the grid electrode can control photoelectrons at the stage of low acceleration. Therefore, since the control range of the output signal by the grid electrode can be increased, it is possible to obtain a circuit having a large amplification range.

The photoelectric conversion unit may have a transmission type photoelectric surface. According to such a configuration, since the structure or arrangement of the grid electrode and the anode is simplified, the vacuum tube for amplifier circuit can be made small.

The photoelectric conversion unit may have a reflection type photoelectric surface. According to such a configuration, since it is possible to obtain a photoelectric surface having high photoelectric conversion efficiency, it is possible to obtain a circuit having a large amplification range.

The vacuum tube for amplifier circuit may further include: a housing unit formed of a conductive material for fixing the incidence window portion; and a light transmissive electrode that is provided between the incidence window portion and the photoelectric conversion unit and is electrically connected to the housing unit. The anode may be formed by the housing unit and the light transmissive electrode. According to such a configuration, photoelectrons can be captured more effectively by the housing unit and the light transmissive electrode.

The light transmissive electrode may be provided on the incidence window portion. According to such a configuration, photoelectrons toward the incidence window portion can be captured more effectively.

The light transmissive electrode may include a light transmissive conductive film. According to such a configuration, since the light incidence region of the incidence window portion can be covered with the electrode without a gap, photoelectrons toward the incidence window portion can be captured more effectively.

The light transmissive electrode may be provided so as to protrude from an inner wall of the housing unit, and may have an aperture portion through which the signal light passes. According to such a configuration, photoelectrons toward the incidence window portion can be captured more effectively.

The vacuum tube for amplifier circuit may further include a light transmissive electrode provided between the incidence window portion and the photoelectric conversion unit, and the anode may include the light transmissive electrode. According to such a configuration, photoelectrons toward the incidence window portion can be captured more effectively.

The vacuum tube for amplifier circuit may further include: a housing unit including the incidence window portion; and a light transmissive electrode provided on the housing unit including the incidence window portion. The anode may be formed by the light transmissive electrode. According to such a configuration, photoelectrons toward the incidence window portion can be captured more effectively.

The vacuum tube for amplifier circuit may further include: a first substrate having the incidence window portion; and a second substrate facing the first substrate. The photoelectric conversion unit may be provided on the first substrate or the second substrate, and the anode and the grid electrode may be provided so as to be erected between the first substrate and the second substrate. According to such a configuration, it is possible to obtain a vacuum tube for amplifier circuit that is made small in the thickness direction.

The photoelectric conversion unit may have a pedestal portion provided on the second substrate so as to face the incidence window portion and a reflection type photoelectric surface provided on the pedestal portion, and a counter electrode having the same potential as the photoelectric surface may be provided on the incidence window portion. By providing the counter electrode on the incidence window portion, it is possible to effectively suppress a situation in which photoelectrons emitted from the photoelectric surface are incident on the incidence window portion to charge the incidence window portion.

Using the vacuum tube for amplifier circuit described above, an amplifier circuit including: a driving power supply unit for driving the vacuum tube for amplifier circuit; a control signal output unit that outputs a control signal for controlling the amount of photoelectrons with respect to the grid electrode; and a signal light generation unit that generates signal light toward the incidence window portion may be provided. According to such a configuration, it is possible to suppress heat generation and realize a small amplifier circuit.

The signal light generation unit may include a semiconductor light emitting element. According to such a configuration, it is possible to realize a smaller amplifier circuit.

The signal light generation unit may include a monitor unit that monitors an amount of light of the semiconductor light emitting element, and the amount of light of the semiconductor light emitting element may be controlled to be constant based on a signal from the monitor unit. According to such a configuration, since the amount of signal light can be kept constant accurately, it is possible to perform amplification with higher accuracy.

A plurality of sets of the vacuum tube for amplifier circuit and the signal light generation unit may be provided, and light may be blocked between adjacent sets of the vacuum tube for amplifier circuit and the signal light generation unit. According to such a configuration, it is possible to perform amplification with higher accuracy without being affected by the light from the adjacent signal light generation units.

Advantageous Effects of Invention

According to one aspect of the present invention, it is possible to provide a vacuum tube for amplifier circuit capable of suppressing heat generation and realizing a small amplifier circuit.

BRIEF DESCRIPTION OF DRAWINGS

FIG. 6(a) is a plan view and FIG. 6(b) is a cross-sectional view.

FIG. 7(a) is a plan view and FIG. 7(b) is a cross-sectional view.

DESCRIPTION OF EMBODIMENTS

First Embodiment

Figure 1:
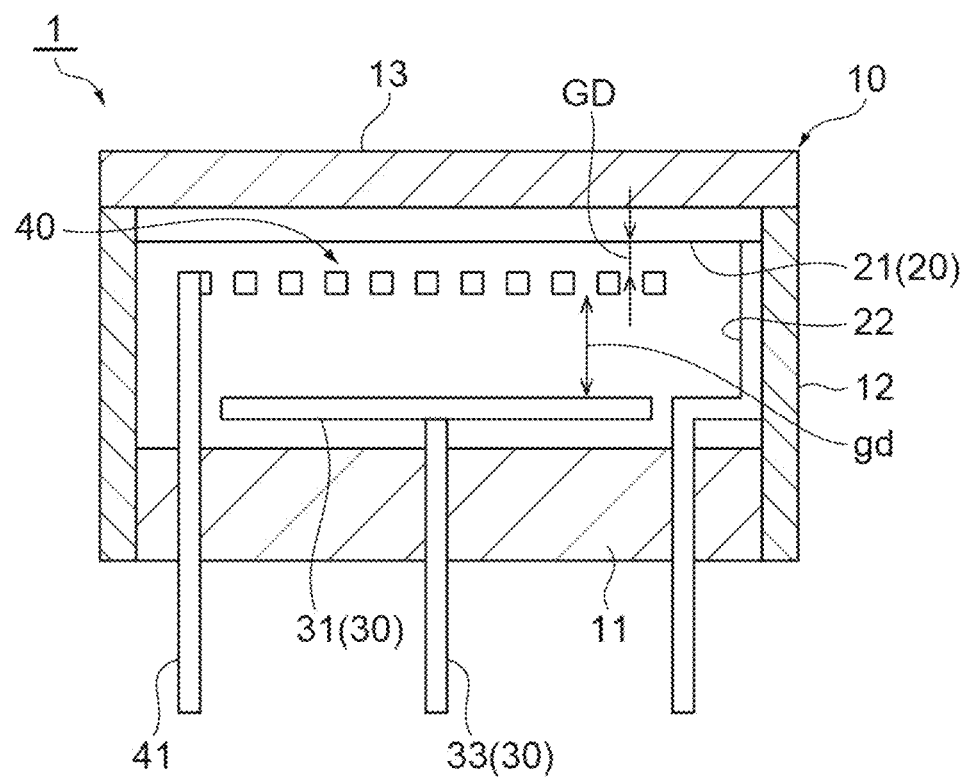
FIG. 1 is a cross-sectional view schematically showing a vacuum tube for amplifier circuit according to a first embodiment of the present invention.

Hereinafter, a first embodiment of the present invention will be described in detail with reference to the diagrams. In addition, the same or equivalent portions in the diagrams are denoted by the same reference numerals, and repeated descriptions thereof will be omitted.

FIG. 1 is a cross-sectional view schematically showing a vacuum tube for amplifier circuit 1 according to the first embodiment. The vacuum tube for amplifier circuit 1 is, for example, a vacuum tube for an amplifier circuit for audio or an amplifier circuit for musical instruments (guitar). In addition, the vacuum tube for amplifier circuit 1 may be a vacuum tube relevant to an amplifier circuit other than the above-described amplifier circuits for audio and the like. The vacuum tube for amplifier circuit 1 uses the technology of a photomultiplier tube. As shown in FIG. 1, the vacuum tube for amplifier circuit 1 includes a bulb 10 (vacuum housing), a photoelectric conversion unit 20, an output unit 30, and a grid electrode 40.

The bulb 10 is a cylindrical member. The bulb 10 has a stem 11, a side tube 12, and a light incidence window 13 (incidence window portion). The stem 11 is a disk-shaped member formed of an insulating material, such as glass (Kovar glass) or ceramic. Here, the stem 11 is formed of ceramic. The light incidence window 13 is a disk-shaped member formed of a light transmissive material, such as glass (Kovar glass), and is disposed so as to face the stem 11. The light incidence window 13 functions as a window portion on which light (signal light) from an LED 80 (semiconductor light emitting element, refer to FIG. 2), which is a light source, is incident. The LED 80 emits a constant amount of light. The side tube 12 is a member formed of a conductive material, such as Kovar metal, or an insulating material, such as Kovar glass. Here, the side tube 12 is formed of Kovar metal and is provided along the circumference of the stem 11, and is erected so as to connect the stem 11 and the light incidence window 13 to each other. Hereinafter, the direction from the stem 11 toward the light incidence window 13 may be described as "up", and the direction from the light incidence window 13 toward the stem 11 may be described as "down". The bulb 10 is a vacuum housing that maintains vacuum airtightness in a state in which the photoelectric conversion unit 20, an anode 31 of the output unit 30, and the grid electrode 40 are housed.

The photoelectric conversion unit 20 converts light transmitted through the light incidence window 13 into photoelectrons. The photoelectric conversion unit 20 has a transmission type photoelectric surface 21 that emits the converted photoelectrons in the transmission direction. The photoelectric surface 21 is formed of, for example, multialkali, NaK, CsTe, GaN, and the like, but is not limited thereto. In addition, from the viewpoint of eliminating noise light from the outside on the photoelectric surface 21, a solar blind photoelectric surface (photoelectric surface formed of CsTe, GaN, and the like) having no sensitivity to visible light may be used. The photoelectrons emitted from the photoelectric surface 21 move downward (toward the anode 31). The photoelectric surface 21 is formed on the inner surface of the light incidence window 13, and is electrically connected to a stem pin 22 for power supply so that a desired potential is supplied. The stem pin 22 is electrically connected to the photoelectric surface 21 and extends downward so as to penetrate the stem 11. In addition, when the side tube 12 is formed of a conductive material, if the photoelectric surface 21 and the side tube 12 are electrically connected to each other, the stem pin 22 may be electrically connected to the side tube 12, or the stem pin 22 may be eliminated and a desired potential may be supplied to the photoelectric surface 21 through the side tube 12.

The output unit 30 has the anode 31 on which photoelectrons are incident and a stem pin 33, and outputs a signal corresponding to the incident photoelectrons. The anode 31 is a plate material formed of a metal material, such as nickel or stainless steel. The anode 31 is connected to the upper end of the stem pin 33, and is disposed near the upper surface of the stem 11. The anode 31 is disposed at a position spaced apart from the upper surface of the stem 11 by the stem pin 33 for power supply. The stem pin 33 is connected to the anode 31 and extends downward so as to penetrate the stem 11. An amplifier element 32 (refer to FIG. 2) is connected after the output unit 30. The amplifier element 32 converts a current signal output from the anode 31 through the stem pin 33 into a voltage signal, and outputs the voltage signal as an output signal (amplification signal). The output destination of the output signal differs depending on the application of the vacuum tube for amplifier circuit 1. In the case of audio application, the output destination of the output signal is, for example, a headphone, a speaker, or the like.

Figure 3:
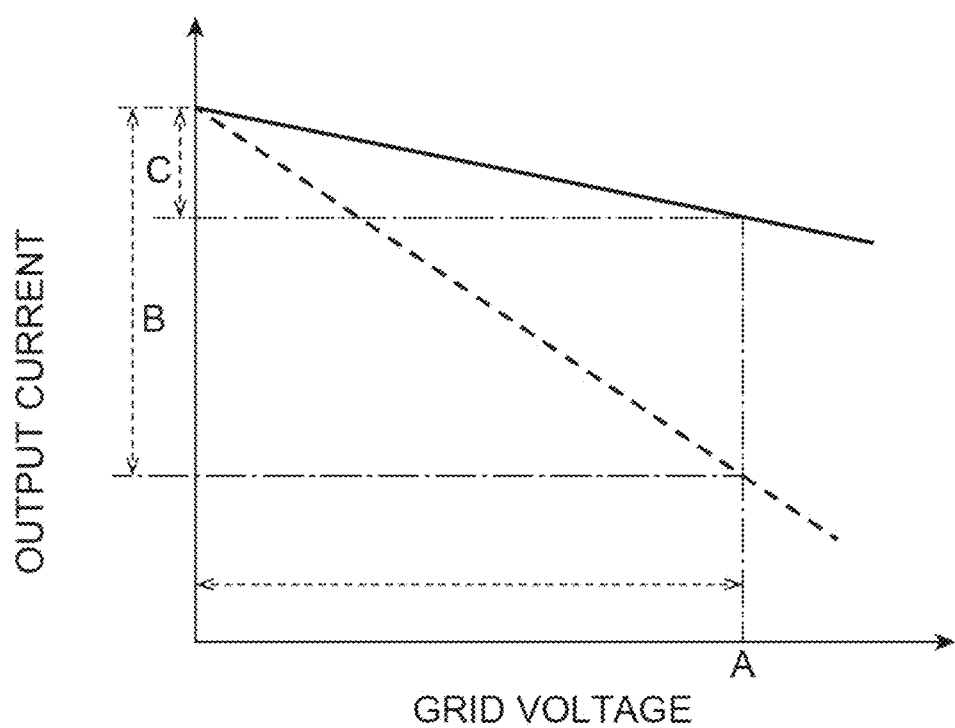
FIG. 3 is a graph showing the relationship between a grid voltage and an output current.

The grid electrode 40 is disposed in the path of photoelectrons from the photoelectric surface 21 of the photoelectric conversion unit 20 to the anode 31 to control the amount of photoelectrons incident on the anode 31. The amount of photoelectrons is controlled according to the grid voltage reflecting the control signal input to the grid electrode 40. The control signal (grid voltage) is output from a control signal output unit 400, which will be described later, based on, for example, a signal input from a sound source or the like. The amount of photoelectrons is controlled so as to decrease (suppress the passage of photoelectrons) as the grid voltage increases (the voltage difference between the photoelectric surface 21 and the grid electrode 40 increases). Therefore, the relationship between the grid voltage and the output current (output current from the anode 31) is inversely proportional as shown in FIG. 3.

The grid electrode 40 is a plate-shaped member having a mesh-like portion, a grid-like portion, or a net-like portion in which through holes allowing photoelectrons to pass therethrough are formed, and is formed of a metal material, such as nickel or stainless steel. The grid electrode 40 is connected to the upper end of a stem pin 41, and is disposed in a region between the photoelectric surface 21 and the anode 31. The stem pin 41 is connected to the grid electrode 40 and extends downward so as to penetrate the stem 11.

Figure 4:
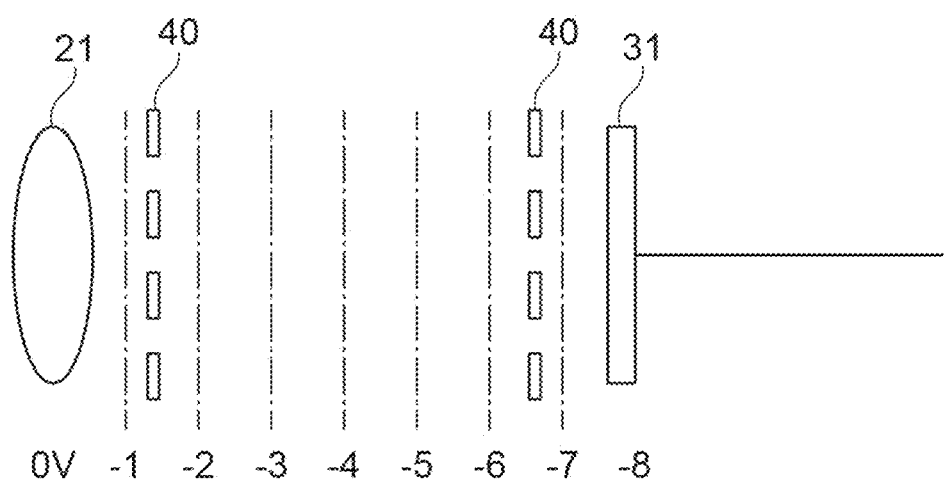
FIG. 4 is a diagram illustrating the relationship between a separation distance and a potential difference for a photoelectric surface and a grid electrode.

The grid electrode 40 is disposed so that a separation distance GD from the photoelectric surface 21 is shorter than a separation distance gd from the anode 31. That is, the grid electrode 40 is disposed in a region near the photoelectric surface 21 in the bulb 10. As shown in FIG. 4, it is conceivable that the grid electrode 40 is disposed in a region near the photoelectric surface 21 in the bulb 10 and disposed in a region near the anode 31 in the bulb 10. Here, the potential difference from the photoelectric surface 21 becomes smaller in a region closer to the photoelectric surface 21. For this reason, since the acceleration force (energy) of photoelectrons is smaller in a region where the potential difference from the photoelectric surface 21 is smaller, control can be performed with a lower grid voltage. Therefore, by arranging the grid electrode 40 in a region near the photoelectric surface 21, it is possible to control the output signal more efficiently according to the grid voltage (with a wide output adjustment range even in the same grid voltage range). Widening the output adjustment range means increasing the amount of change in the output current from the anode 31 with respect to the amount of change in the grid voltage. FIG. 3 shows, for the same amount of change A in grid voltage, a case where the amount of change in output current is the amount of change C and a case where the amount of change in output current is the amount of change B larger than the amount of change C. In this case, when the amount of change in the output current is the amount of change B, the output adjustment range can be made wider, and accordingly the performance as an amplifier circuit is higher.

As an example of the applied voltage in each configuration, it is conceivable to set the photoelectric surface 21 to have a ground potential and set the anode 31 to have +5 to +100 V (for example, +12 V) so that the potential difference between the photoelectric surface 21 and the anode 31 is 5 to 100 V (for example, +12 V) and set the grid voltage to about 0 to +6 V. In the vacuum tube for amplifier circuit 1, the amount of light output from the LED 80 (refer to FIG. 2) is constant (that is, the amount of photoelectrons emitted from the photoelectric surface (photoelectric surface current) is constant) and the potential difference between the photoelectric surface 21 and the anode 31 is also constant, and only the grid voltage is a variable.

Figure 2:
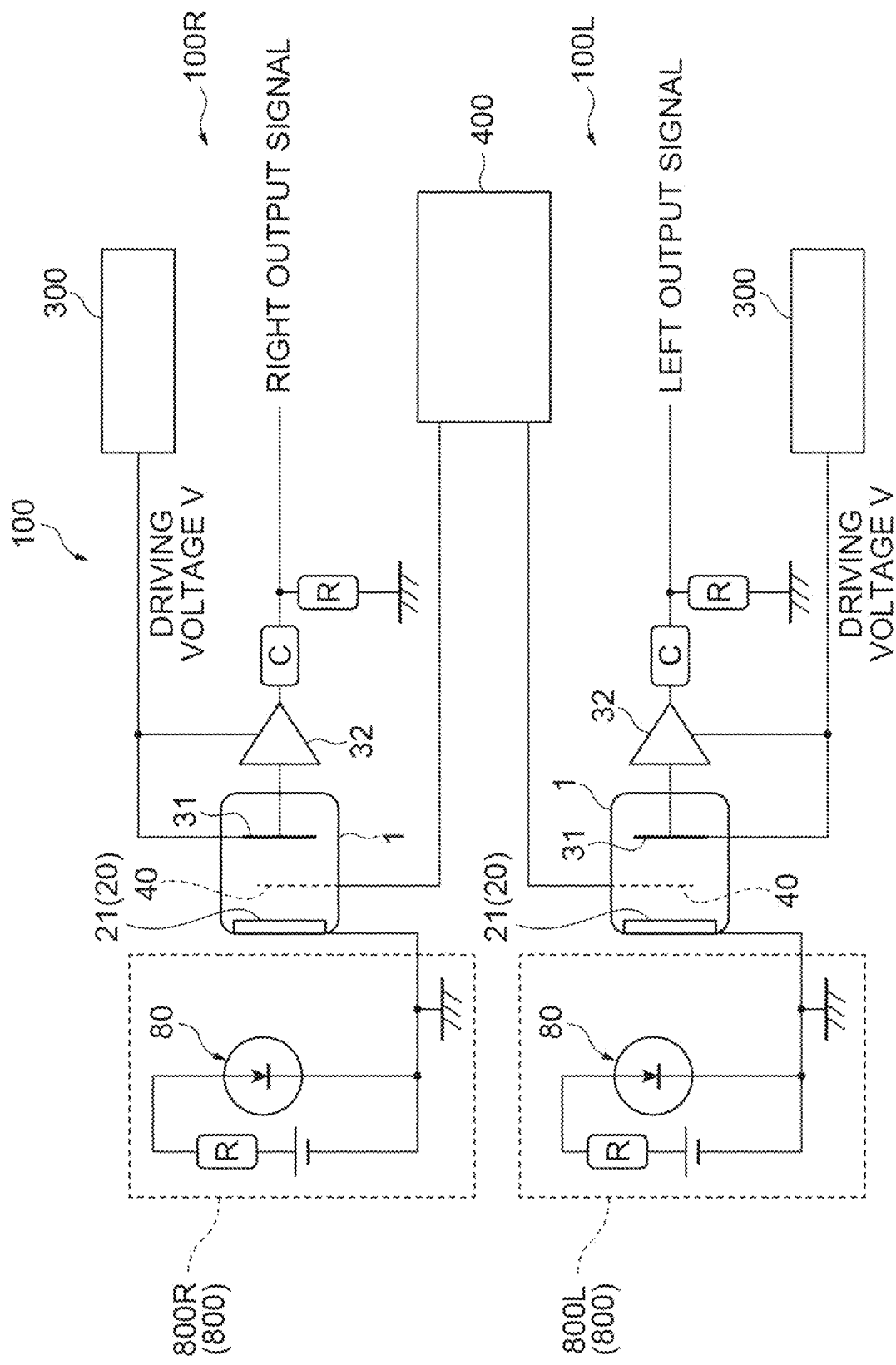
FIG. 2 is a circuit diagram relevant to the vacuum tube for amplifier circuit shown in FIG. 1.

Next, an example of an amplifier circuit relevant to the vacuum tube for amplifier circuit 1 shown in FIG. 1 will be described with reference to FIG. 2. In addition, an amplifier circuit 100 of FIG. 2 is shown by simplifying the circuit relevant to the vacuum tube for amplifier circuit 1 for convenience of explanation. FIG. 2 shows a circuit diagram with amplifier circuits (a right amplifier circuit 100R and a left amplifier circuit 100L), which are amplifier circuits for audio and which use a pair of left and right vacuum tube for amplifier circuits 1 to support stereo output, as an example.

As shown in FIG. 2, each of the right amplifier circuit 100R and the left amplifier circuit 100L is provided such that a signal light generation unit 800 (a right signal light generation unit 800R and a left signal light generation unit 800L) including the LED 80 as a configuration in which a constant amount of signal light is incident on the photoelectric surface 21 through the light incidence window 13 faces each vacuum tube for amplifier circuit 1. The LED 80 emits light having a wavelength shorter than, for example, 450 nm, specifically, light in an ultraviolet light region, as signal light. The photoelectric surface 21 is connected to the ground potential and the anode 31 is connected to a driving power supply unit 300, so that a driving voltage V is supplied. Then, the grid electrode 40 is disposed between the photoelectric surface 21 and the anode 31, and a grid voltage corresponding to a control signal is input from the control signal output unit 400 to each grid electrode 40 on the left and right sides based on an input signal from a sound source or the like. The amount of photoelectrons incident on the anode 31 is controlled according to the grid voltage. Then, a current signal is output from the anode 31 according to the amount of photoelectrons, the current signal is converted into a voltage signal by the amplifier element 32, and the voltage signal is output to a headphone, a speaker, or the like as an output signal. In addition, by using the right amplifier circuit 100R and the left amplifier circuit 100L as amplifier circuits in the front stage, the output signal based on the voltage signal may be used as an input signal to the amplifier circuit in the rear stage. In addition, when a constant amount of signal light is incident on the photoelectric surface 21 through the light incidence window 13, the signal light generation unit 800 may be a single signal light generation unit 800 without being divided into the right signal light generation unit 800R and the left signal light generation unit 800L. However, in order to obtain a higher amplification effect, a larger amount of photoelectrons are required. Therefore, in order to obtain a sufficient amount of signal light, the signal light generation unit 800 may be provided separately on the left and right sides. In addition, when control is performed also by changing the amount of signal light, a light blocking unit (not shown) that blocks light between a set of the right signal light generation unit 800R and the vacuum tube for amplifier circuit 1 facing the right signal light generation unit 800R and a set of the left signal light generation unit 800L and the vacuum tube for amplifier circuit 1 facing the left signal light generation unit 800L may be provided. In addition, when the amount of signal light is constant, for example, even if some of the light from the right signal light generation unit 800R is incident on the vacuum tube for amplifier circuit 1 of the left signal light generation unit 800L, there is no problem as long as the amount of incident light is always constant. Therefore, the operation is basically possible without blocking light.

Next, the operation and effect of the vacuum tube for amplifier circuit 1 according to the first embodiment will be described.

As described above, the vacuum tube for amplifier circuit 1 includes: the light incidence window 13 that transmits signal light; the photoelectric conversion unit 20 that converts the signal light transmitted through the light incidence window 13 into photoelectrons; the output unit 30 that has the anode 31 on which photoelectrons are incident and that outputs a signal corresponding to the incident photoelectrons; and the grid electrode 40 that is disposed in the path of photoelectrons from the photoelectric conversion unit 20 to the anode 31 and controls the amount of photoelectrons incident on the anode 31. In the vacuum tube for amplifier circuit 1 according to the first embodiment, the signal light is converted into photoelectrons by the photoelectric conversion unit 20, and the signal corresponding to the photoelectrons is output from the output unit 30. Then, in the vacuum tube for amplifier circuit 1, the amount of photoelectrons incident on the anode 31 of the output unit 30 is controlled by the grid electrode 40. Therefore, the signal output from the output unit 30 can be controlled by the grid electrode 40 (specifically, according to the grid voltage). In such a configuration, since the output signal can be appropriately controlled without adopting a thermionic source, such as a filament, as an electron source, it is possible to suppress heat generation and realize the small amplifier circuit 100.

The photoelectric conversion unit 20 has a transmission type photoelectric surface 21 that emits the converted photoelectrons in the transmission direction. According to such a configuration, since the structure or arrangement of the grid electrode 40 and the anode 31 is simplified, the vacuum tube for amplifier circuit 1 can be made small. In addition, when it is desired to provide the photoelectric surface 21 near the photoelectric conversion unit 20, the photoelectric surface 21 can be appropriately disposed.

The separation distance between the photoelectric surface 21 and the grid electrode 40 is shorter than the separation distance between the grid electrode 40 and the anode 31. Thus, since the separation distance between the photoelectric surface 21 and the grid electrode 40 is short, it is possible to control photoelectrons at the stage of low acceleration (stage where the potential difference from the photoelectric surface 21 is small). Therefore, since the control range of the output signal by the grid electrode 40 can be increased, it is possible to obtain a circuit having a large amplification range.

The amplifier circuit 100 includes the driving power supply unit 300 for driving the vacuum tube for amplifier circuit 1, the control signal output unit 400 for outputting a control signal for controlling the amount of photoelectrons to the grid electrode 40, and the signal light generation unit 800 that generates signal light toward the light incidence window 13. According to such a configuration, it is possible to suppress heat generation and realize a small amplifier circuit.

The signal light generation unit 800 may include the LED 80. According to such a configuration, it is possible to realize a smaller amplifier circuit. In addition, since it is easy to change the amount of light by controlling the power to be supplied, it is also possible to perform finer output signal adjustment considering a change in the amount of signal light in addition to the control by the grid electrode 40. For example, by making the output waveform variable, this can be used as an effector that gives an audio effect to the sound converted into an electric signal.

A plurality of sets of the vacuum tube for amplifier circuit 1 and the signal light generation unit 800 (the right signal light generation unit 800R and the left signal light generation unit 800L) may be provided, and light may be blocked between adjacent sets of the vacuum tube for amplifier circuit 1 and the signal light generation unit 800 (the right signal light generation unit 800R and the left signal light generation unit 800L). According to such a configuration, particularly when the amount of signal light is changed, it is possible to perform amplification with higher accuracy without being affected by the light from the adjacent signal light generation units (the right signal light generation unit 800R and the left signal light generation unit 800L).

Second Embodiment

Hereinafter, a second embodiment of the present invention will be described with reference to FIG. 5. In addition, in the description of the second embodiment, descriptions repeating those in the first embodiment will be omitted.

Figure 5:
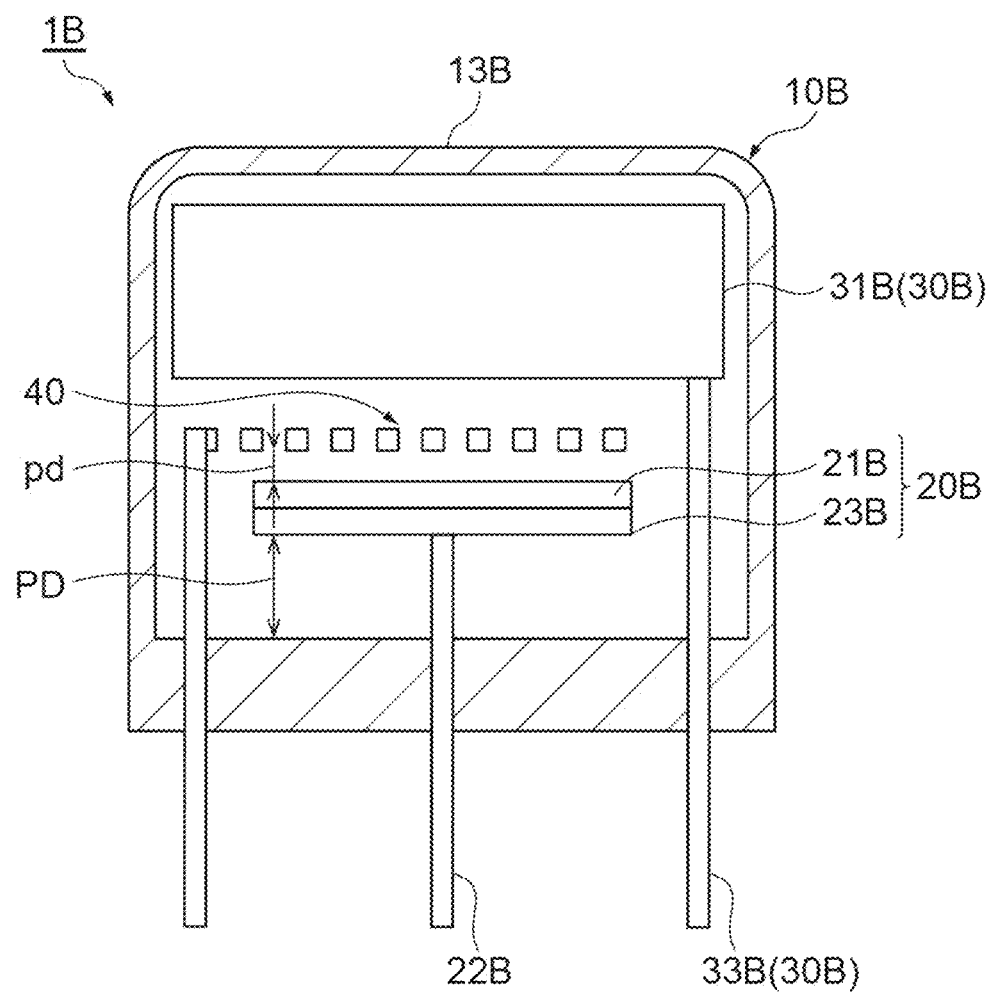
FIG. 5 is a cross-sectional view schematically showing a vacuum tube for amplifier circuit according to a second embodiment of the present invention.

FIG. 5 is a cross-sectional view schematically showing a vacuum tube for amplifier circuit 1B according to the second embodiment. As shown in FIG. 5, the vacuum tube for amplifier circuit 1B includes a bulb 10B, a photoelectric conversion unit 20B, an output unit 30B, and a grid electrode 40. Since the grid electrode 40 is the same as that in the first embodiment described above, the description thereof will be omitted.

The bulb 10B is a bulb formed of a light transmissive insulating material in which the entire housing (including a stem, a side tube, and a light incidence window 13B) that maintains vacuum airtightness is integrally formed. For example, the bulb 10B is formed of glass (Kovar glass).

The photoelectric conversion unit 20B has a photoelectric surface 21B and a cathode 23B, and is a reflection type photoelectric surface that emits photoelectrons so as to be reflected in the incidence direction of signal light. The photoelectric surface 21B is provided on the cathode 23B. The photoelectric surface 21B and the cathode 23B are disposed apart from the upper surface of the stem in the bulb 10B. The photoelectric surface 21B is formed of, for example, multi-alkali, NaK, CsTe, and the like, but is not limited thereto. The cathode 23B is a plate member formed of a metal material, such as nickel or stainless steel, and is connected to the upper end of a stem pin 22B for power supply. The stem pin 22B is connected to the cathode 23B and extends downward so as to penetrate the stem of the bulb 10B.

In addition, in the vacuum tube for amplifier circuit 1B, the reflection type photoelectric conversion unit 20B is disposed on the stem side of the bulb 10B. For this reason, the heat generated when the bulb 10B is vacuum-sealed on the stem side may affect the surface condition of the photoelectric conversion unit 20B (photoelectric surface 21B itself or the cathode 23B that is a photoelectric surface forming unit). In order to suppress this, the photoelectric conversion unit 20B may be spaced apart from the stem of the bulb 10B. For example, the photoelectric conversion unit 20B and the stem may be spaced apart from each other to such an extent that a separation distance PD between the photoelectric conversion unit 20B and the stem is equal to or greater than a separation distance (pd) between the photoelectric conversion unit 20B and the grid electrode 40.

The output unit 30B has an anode 31B to which photoelectrons are input and a stem pin 33B. The anode 31B is a cylindrical member that is formed of a metal material, such as nickel or stainless steel, and includes a through hole that communicates vertically so that signal light passes therethrough. The anode 31B is connected to the upper end of the stem pin 33B, and is disposed near (immediately below) the light incidence window in the bulb 10B. The stem pin 33B is connected to the anode 31B and extends downward so as to penetrate the stem of the bulb 10B.

In such a vacuum tube for amplifier circuit 1B, the signal light incident from the light incidence window 13B of the bulb 10B passes through the through hole of the anode 31B and the grid electrode 40 and is incident on the photoelectric conversion unit 20B, is converted into photoelectrons on the photoelectric surface 21B and emitted in the reflection direction, and is incident on the cylindrical anode 31B through the grid electrode 40. Then, a current signal is output from the anode 31B through the stem pin 33B, the current signal is converted into a voltage signal in the subsequent amplifier element, and the voltage signal is output as an output signal to, for example, a headphone, a speaker, or the like or output as an input signal to a further amplifier circuit.

As described above, in the vacuum tube for amplifier circuit 1B according to the second embodiment, the photoelectric conversion unit 20B has the reflection type photoelectric surface 21B that emits the converted photoelectrons in the reflection direction. According to such a configuration, since the supply of current from the cathode 23B to the photoelectric surface 21B can be satisfactorily performed, it is possible to obtain a photoelectric surface having high photoelectric conversion efficiency. Therefore, it is possible to obtain a circuit having a large amplification range.

In addition, since the reflection type photoelectric surface 21B is provided on the cathode 23B, an approximately uniform voltage can be applied over the entire region of the photoelectric surface 21B.

Third Embodiment

Hereinafter, a third embodiment of the present invention will be described with reference to FIGS. 6(a) and 6(b). In addition, in the description of the third embodiment, descriptions repeating those in the first and second embodiments will be omitted.

Figure 6:
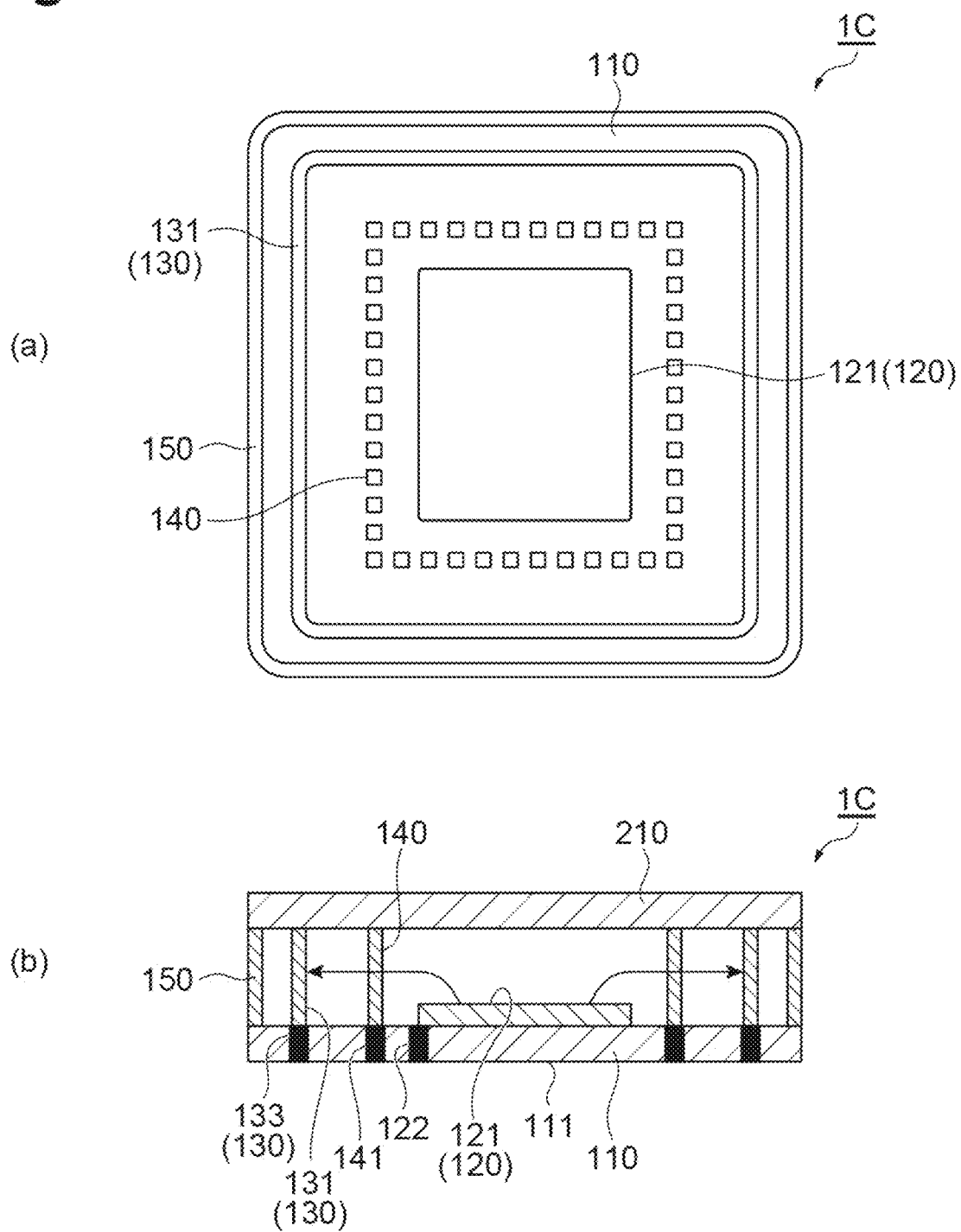
FIG. 6 is a diagram schematically showing a vacuum tube for amplifier circuit according to a third embodiment of the present invention, where

FIG. 6 is a diagram schematically showing a vacuum tube for amplifier circuit 1C according to the third embodiment, where FIG. 6(a) is a plan view and FIG. 6(b) is a cross-sectional view. The vacuum tube for amplifier circuit 1C is a vacuum tube manufactured by using the semiconductor manufacturing technology. Such a vacuum tube is superior in terms of miniaturization and mass production. As shown in FIGS. 6(a) and 6(b), the vacuum tube for amplifier circuit 1C includes substrates 110 and 210 (a first substrate and a second substrate), a photoelectric conversion unit 120, an output unit 130, a grid electrode 140, and a side tube 150. The vacuum tube for amplifier circuit 1C is manufactured by etching a silicon substrate to form an anode 131 of the output unit 130, the grid electrode 140, and the side tube 150 and interposing and sealing these between the substrates 110 and 210 so as to be erected therebetween. In addition, the substrate 210 is not shown in FIG. 6(a), which is a plan view.

The substrate 110 is a rectangular substrate formed of a light transmissive insulating material, such as glass (Kovar glass or borosilicate glass), and has a light incidence window 111 (incidence window portion). The substrate 210 is a rectangular substrate formed of an insulating material, such as glass (Kovar glass or borosilicate glass), and is disposed so as to face the substrate 110. As described above, the substrate 110 and the substrate 210 are provided so as to interpose the anode 131, the grid electrode 140, and the side tube 150 therebetween. Hereinafter, the direction from the substrate 110 to the substrate 210 may be described as "up", and the direction from the substrate 210 to the substrate 110 may be described as "down".

The photoelectric conversion unit 120 converts light transmitted through the light incidence window 111 into photoelectrons. The photoelectric conversion unit 120 has a transmission type photoelectric surface 121 that emits the converted photoelectrons in the transmission direction. The photoelectric surface 121 is disposed (placed) on the substrate 110 so as to cover a light transmissive conductive material film (not shown). Alternatively, the photoelectric surface 121 may be provided so as to cover a frame-shaped conductive material film. The conductive material film is formed by depositing a metal material, such as aluminum, with a film thickness sufficient to provide a light transmission property. As shown in FIG. 6(a), the photoelectric surface 121 is disposed at the approximately central portion of the substrate 110. The photoelectric surface 121 is formed of, for example, multi-alkali, NaK, CsTe, and the like, but is not limited thereto. The photoelectric surface 121 is connected to a power application terminal 122 for power supply on the substrate 110. The power application terminal 122 is formed of, for example, Kovar metal, tungsten, or the like. As indicated by the arrows in FIG. 6(b), photoelectrons emitted from the photoelectric surface 121 move toward the anode 131 in directions of outer end portions of the substrate 110.

The output unit 130 has the anode 131 to which photoelectrons are input and a power application terminal 133, and outputs a signal corresponding to the input photoelectrons. The anode 131 is erected so as to be interposed between the substrates 110 and 210 (refer to FIG. 6(b)). In a plan view, the anode 131 is disposed in an approximately rectangular shape, which has the center of the substrate 110 as its center, in a region of the substrate 110 located further outward than the photoelectric surface 121 (refer to FIG. 6(a)). The anode 131 is connected to the power application terminal 133 for power supply and output on the substrate 110. The power application terminal 133 is formed of, for example, Kovar metal, tungsten, or the like.

The grid electrode 140 is disposed in the path of photoelectrons from the photoelectric surface 121 to the anode 131, and controls the amount of photoelectrons input to the anode 131. The grid electrode 140 is a grid-like member in which columnar structures are disposed in wall shapes. The grid electrode 140 is erected so as to be interposed between the substrates 110 and 210 (refer to FIG. 6(b)). In a plan view, the grid electrode 140 is disposed in an approximately rectangular shape, which has the center of the substrate 110 as its center, at a position close to the photoelectric surface 121 in a region between the photoelectric surface 121 and the anode 131 on the substrate 110 (refer to FIG. 6(a)). The grid electrode 140 is connected to a power application terminal 141 for power supply on the substrate 110. The power application terminal 141 is formed of, for example, Kovar metal, tungsten, or the like.

The side tube 150 is erected so as to be interposed between the outer edge regions of the substrates 110 and 210 (refer to FIG. 6(b)), and vacuum airtightness is maintained by the side tube 150, the substrates 110 and 210, and the power application terminals 122, 133, and 141. In a plan view, the side tube 150 is disposed in an approximately rectangular shape, which has the center of the substrate 110 as its center, in a region of the substrate 110 located further outward than the anode 131 (refer to FIG. 6(a)).

In addition, although it has been described that the substrate 110 has the light incidence window 111, the present invention is not limited thereto, and the substrate 210 may have a light incidence window (incidence window portion). In this case, the photoelectric conversion unit 120 has a reflection type photoelectric surface that emits photoelectrons in the reflection direction. In addition, the reflection type photoelectric surface is formed on a conductive material film on the substrate 110. Alternatively, the substrate 110 itself may be formed of a conductive material, such as a metal material, and may be insulated from the grid electrode 140, the side tube 150, and the power application terminals 133 and 141. In this case, the power application terminal 122 is not necessary.

Fourth Embodiment

Hereinafter, a fourth embodiment of the present invention will be described with reference to FIGS. 7(a) and 7(b). In addition, in the description of the fourth embodiment, descriptions repeating those in the first to third embodiments will be omitted.

Figure 7:
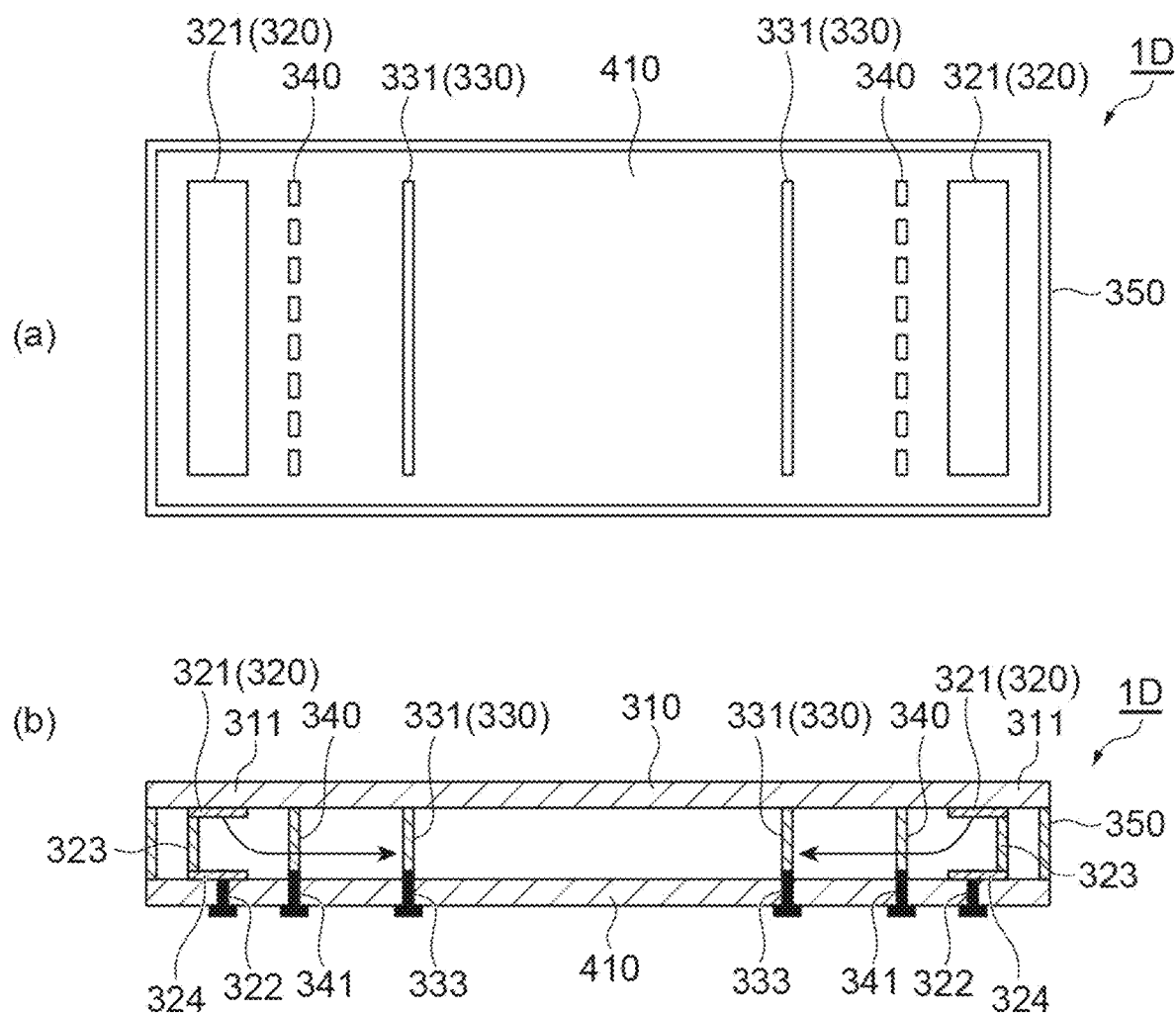
FIG. 7 is a diagram schematically showing a vacuum tube for amplifier circuit according to a fourth embodiment of the present invention, where

FIG. 7 is a diagram schematically showing a vacuum tube for amplifier circuit 1D according to the fourth embodiment, where FIG. 7(a) is a plan view and FIG. 7(b) is a cross-sectional view. The vacuum tube for amplifier circuit 1D is a vacuum tube manufactured by using the semiconductor manufacturing technology. For example, the vacuum tube for amplifier circuit 1D is a vacuum tube for amplifier circuit that enables stereo output with one vacuum tube for amplifier circuit instead of using a pair of left and right vacuum tube for amplifier circuits 1, that is, two vacuum tube for amplifier circuits 1, when used in a circuit that is an amplifier circuit for audio, such as that shown in FIG. 2, and corresponds to the stereo output. As shown in FIGS. 7(a) and 7(b), the vacuum tube for amplifier circuit 1D includes substrates 310 and 410 (a first substrate and a second substrate), a pair of photoelectric conversion units 320, a pair of output units 330, a pair of grid electrodes 340 and 340, and a side tube 350. The vacuum tube for amplifier circuit 1D is manufactured by etching a silicon substrate to form an anode 331 of the output unit 330, the grid electrode 340, and the side tube 350 and interposing and sealing these between the substrates 310 and 410 so as to be erected therebetween. In addition, the substrate 310 is not shown in FIG. 7(a), which is a plan view.

The substrate 310 is a rectangular substrate formed of a light transmissive insulating material, such as glass (Kovar glass or borosilicate glass), and has a light incidence window 311 (incidence window portion). The substrate 410 is a rectangular substrate formed of an insulating material, such as glass (Kovar glass or borosilicate glass), and is disposed so as to face the substrate 310. Hereinafter, the direction from the substrate 310 to the substrate 410 may be described as "down", and the direction from the substrate 410 to the substrate 310 may be described as "up".

The photoelectric conversion unit 320 converts light transmitted through the light incidence window 311 into photoelectrons. The photoelectric conversion unit 320 has a pair of transmission type photoelectric surfaces 321 and 321 that emit the converted photoelectrons in the transmission direction. The photoelectric surfaces 321 and 321 are disposed on the inner surface of the substrate 310. More specifically, the photoelectric surfaces 321 and 321 are disposed along the lateral direction of the substrate 310 at both end portions of the substrate 310 in the longitudinal direction. The photoelectric surfaces 321 and 321 are connected to a conductive film 324 disposed on the substrate 410 through a power supply member 323. The conductive film 324 is electrically connected to a power application terminal 322 for power supply on the substrate 410. As indicated by the arrows in FIG. 7(b), photoelectrons emitted from the photoelectric surfaces 321 and 321 in the transmission direction of the signal light pass through the grid electrodes 340 and 340 and move toward the anodes 331 and 331 in the central direction of the substrate 410.

The output unit 330 has a pair of anodes 331 and 331 to which photoelectrons are input and power application terminals 333 and 333, and outputs a signal corresponding to the incident photoelectrons. The anodes 331 and 331 are erected so as to be interposed between the substrates 310 and 410 (refer to FIG. 7(b)). In a plan view, the anodes 331 and 331 are disposed along the lateral direction of the substrate 410 in a region of the substrate 410 located closer to the center than the photoelectric surface 321 (refer to FIG. 7(a)).

The anodes 331 and 331 are connected to the power application terminals 333 for power supply and output on the substrate 410.

The grid electrodes 340 and 340 are disposed in the path of photoelectrons from the photoelectric surface 321 to the anode 331, and control the amount of photoelectrons input to the anode 331. The grid electrodes 340 and 340 are grid-like members in which columnar structures are disposed in wall shapes. The grid electrodes 340 and 340 are erected so as to be interposed between the substrates 310 and 410 (refer to FIG. 7(b)). In a plan view, the grid electrodes 340 and 340 are disposed along the lateral direction of the substrate 410 at a position close to the photoelectric surface 321 in a region between the photoelectric surface 321 and the anode 331 on the substrate 410 (refer to FIG. 7(a)). Each of the grid electrodes 340 and 340 is connected to a power application terminal 341 for power supply on the substrate 410.

The side tube 350 is erected so as to be interposed between the outer edge regions of the substrates 310 and 410 (refer to FIG. 7(b)), and vacuum airtightness is maintained by the side tube 350, the substrates 310 and 410, and the power application terminals 322, 322, 333, 333, 341, and 341. In a plan view, the side tube 350 is disposed in an approximately rectangular shape, which has the center of the substrate 410 as its center, in a region located further outward than the photoelectric surfaces 321 and 321 (refer to FIG. 7(a)).

Figure 8:
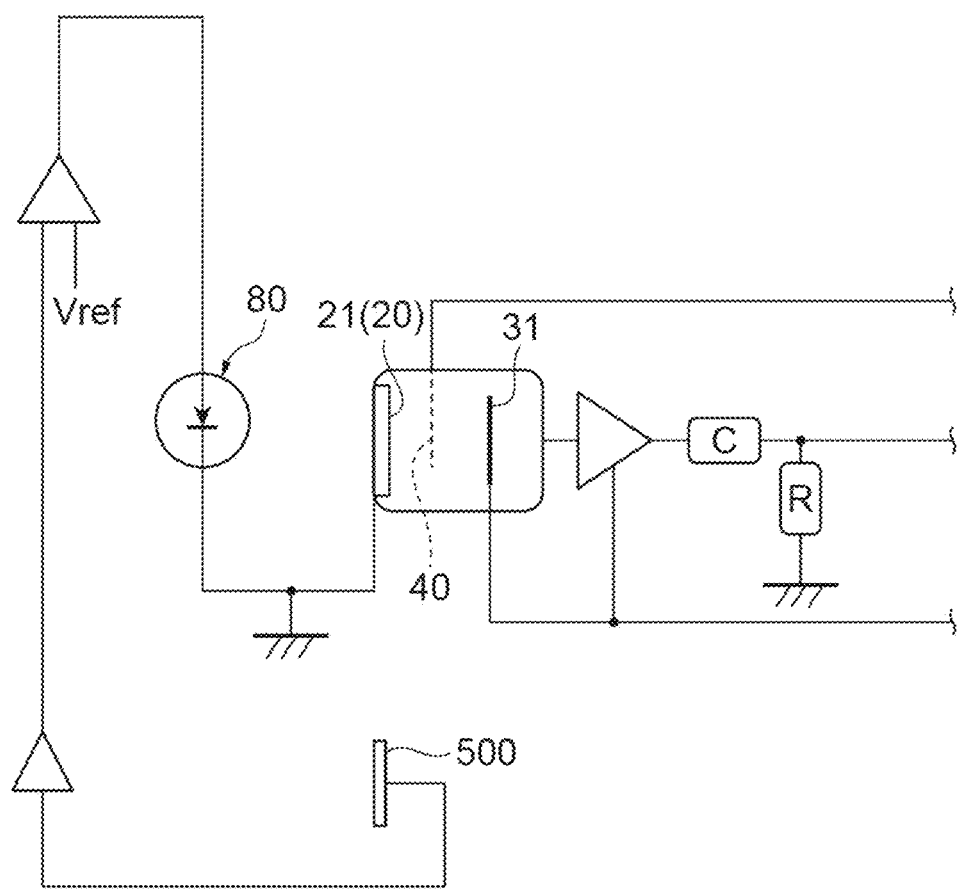
FIG. 8 is a circuit diagram of a vacuum tube for amplifier circuit according to a modification example.

Hereinbefore, although the embodiments of the present invention have been described, the present invention is not limited to the above embodiments. For example, as shown in the circuit diagram of FIG. 8, the vacuum tube for amplifier circuit may further include a monitor unit 500 for monitoring the amount of signal light output from the LED 80. The monitor unit 500 is, for example, a photodiode. By inputting the driving voltage to the LED 80, the amount of light of the LED 80 is determined. Then, the monitor unit 500 monitors the amount of light output from the LED 80, and controls the amount of light of the LED 80 to be constant based on the signal from the monitor unit 500. More specifically, by changing the driving voltage of the LED 80 according to a change (output change) in the amount of light indicated by the signal from the monitor unit 500, a change (output change) in the amount of signal light can be corrected. According to such a configuration, since the amount of signal light can be kept constant accurately, it is possible to perform amplification with higher accuracy. For example, when the technique of the present invention is used for a vacuum tube for amplifier circuit for audio, whether or not the amount of light output from the LED 80 is stable can be determined without depending on the actual sound (human ear), and the amount of light can be stabilized if necessary. In addition, the voltage applied to each unit, such as an anode, may be changed according to the monitoring result of the monitor unit 500.

Figure 9:
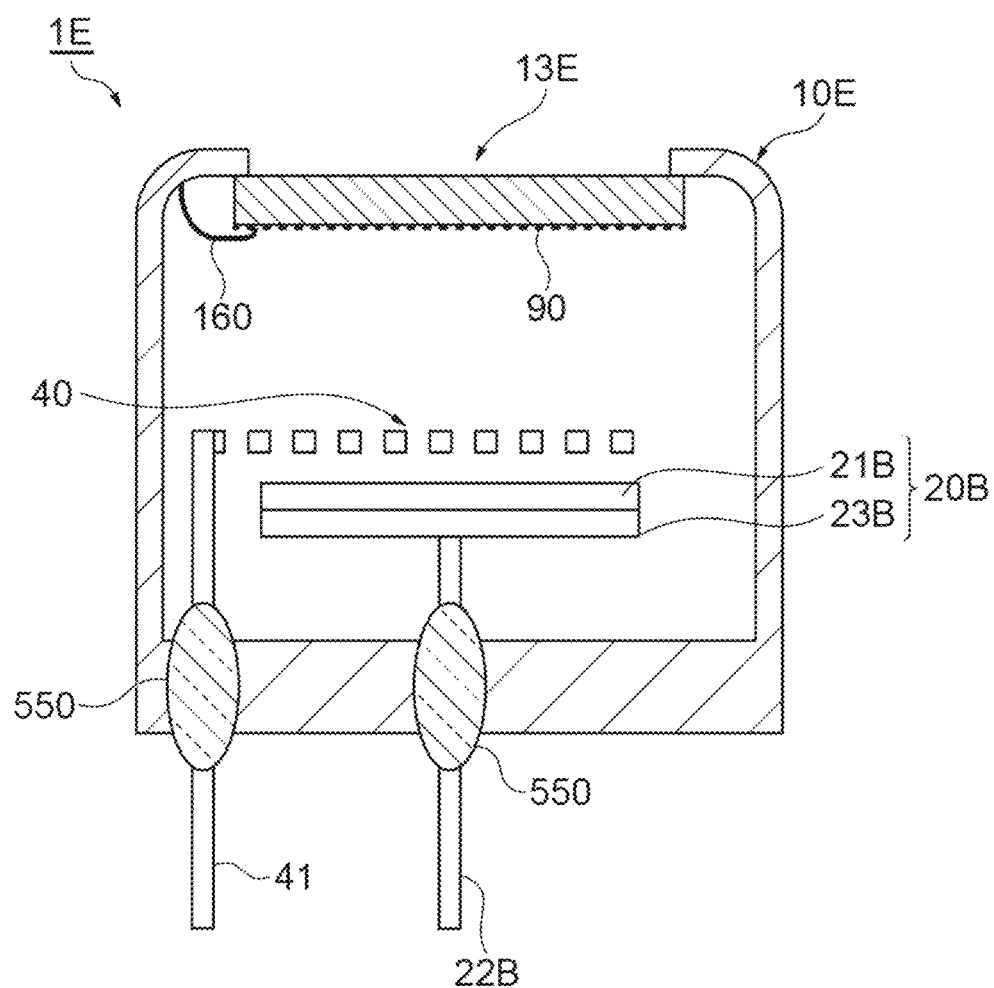
FIG. 9 is a cross-sectional view schematically showing a vacuum tube for amplifier circuit according to a modification example.

In addition, as a modification example of the form using the photoelectric conversion unit 20B having a reflection type photoelectric surface, a configuration shown in FIG. 9 may be adopted. A vacuum tube for amplifier circuit 1E shown in FIG. 9 includes a housing 10E for fixing a light incidence window 13E, a photoelectric conversion unit 20B, a grid electrode 40, and a light transmissive electrode 90. Since the photoelectric conversion unit 20B and the grid electrode 40 are the same as those in the second embodiment described above, the description thereof will be omitted.

The housing 10E is a housing formed of a conductive material, for example, a metal such as Kovar metal, and the light incidence window 13E is fixed to an opening portion provided in one end portion of the housing 10E. The housing 10E itself functions as an anode. The potential of the housing 10E is a ground potential. The housing 10E collects photoelectrons that diffuse laterally among the photoelectrons passing through the grid electrode 40. In addition, since the housing 10E is formed of metal, the stem pin 22B and the stem pin 41 are fixed to and insulated from the housing 10E by a fixing member 550 formed of an insulating material (for example, hermetic glass).

The light transmissive electrode 90 is a light transmissive electrode formed on the vacuum side surface of the light incidence window 13E in the housing 10E. The light transmissive electrode 90 is formed by, for example, a light transmissive conductive film formed of ITO, Cr, Al, or the like, or a mesh member. The light transmissive electrode 90 collects photoelectrons that travel in the direction of the light incidence window 13E among the photoelectrons passing through the grid electrode 40. The light transmissive electrode 90 is electrically connected to the housing 10E by an electrical connection portion 160 (for example, wire bonding). In addition, when the light transmissive electrode 90 is formed of a light transmissive conductive film and its thickness is sufficiently large, the light transmissive electrode 90 itself can be electrically connected to the housing 10E (that is, the light transmissive electrode also includes an electrical connection portion) by continuously forming the light transmissive electrode 90 from the light incidence window 13E to a part of the housing 10E. Therefore, the electrical connection portion 160 such as the wire bonding described above is not necessary. In addition, even when the light transmissive electrode 90 is formed of a mesh member, the electrical connection portion 160 can be similarly eliminated by bringing the mesh member into direct contact with the housing 10E. In the light transmissive electrode 90, for example, if only the central region serving as the path (optical path) of the signal light is light transmissive, the peripheral region may have a light blocking property. Thus, by making the peripheral region have a light blocking property, it is possible to reduce noise light.

In the vacuum tube for amplifier circuit 1E, photoelectrons that diffuse laterally among the photoelectrons passing through the grid electrode 40 are collected by the housing 10E that functions as an anode, and photoelectrons that travel in the direction of the light incidence window 13E are collected by the light transmissive electrode 90. That is, in the vacuum tube for amplifier circuit 1E, the anode signal is output as a sum of the signal based on the incidence on the side tube (collected by the housing 10E) and the signal based on the incidence on the light transmissive electrode 90. According to such a configuration, photoelectrons can be captured more effectively as compared with, for example, a configuration in which photoelectrons are collected only by the anode 31B (FIG. 5). In addition, when the light transmissive electrode 90 is formed of a light transmissive conductive film, the light incidence region of the light incidence window 13E can be covered with the electrode without a gap, so that the photoelectrons directed to the light incidence window 13E can be captured more effectively.

Figure 10:
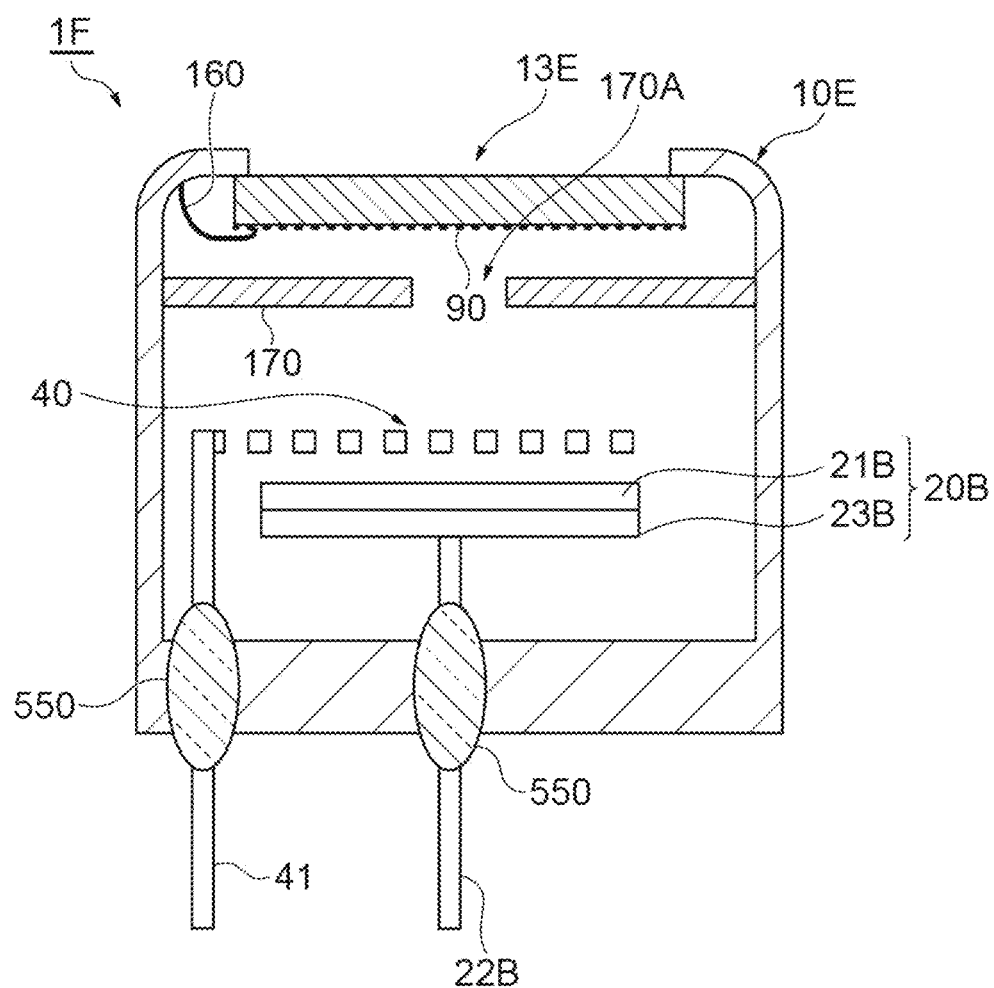
FIG. 10 is a cross-sectional view schematically showing a vacuum tube for amplifier circuit according to a modification example.

In addition, as a modification example of the form using the photoelectric conversion unit 20B having a reflection type photoelectric surface, a configuration shown in FIG. 10 may be adopted. A vacuum tube for amplifier circuit 1F shown in FIG. 10 has almost the same configuration as the vacuum tube for amplifier circuit 1E shown in FIG. 9, but includes a counter electrode 170, which is a light transmissive electrode having an aperture portion 170A through which signal light passes, in addition to the configuration of the vacuum tube for amplifier circuit 1E.

The counter electrode 170 is provided so as to protrude from the inner wall of the housing 10E so as to face the photoelectric surface 21B between the photoelectric surface 21B of the photoelectric conversion unit 20B and the light incidence window 13E (specifically, the light transmissive electrode 90). The counter electrode 170 is formed of a plate-shaped conductive material, such as nickel or Kovar metal. The counter electrode 170 collects photoelectrons traveling in the direction of the light incidence window 13E. The counter electrode 170 has the aperture portion 170A formed at least in a part (on the signal light path) of a portion facing the photoelectric surface 21B so as not to interfere with the signal light. Photoelectrons passing through the aperture portion 170A cannot be collected by the counter electrode 170, but can be collected by the light transmissive electrode 90. By providing the counter electrode 170, a region other than the aperture portion 170A is shielded from light, and the incidence path of light with respect to the photoelectric surface 21B is limited. Therefore, the incident of noise light other than the signal light is suppressed. In addition, in the configuration in which the counter electrode 170 is provided, the light transmissive electrode 90 may not be provided. That is, the counter electrode 170 may be used together with the light transmissive electrode 90, or may be used instead of the light transmissive electrode. The entire counter electrode 170 may have a mesh shape, or only the aperture portion 170A may have a mesh shape so that photoelectrons can be easily collected.

Figure 11:
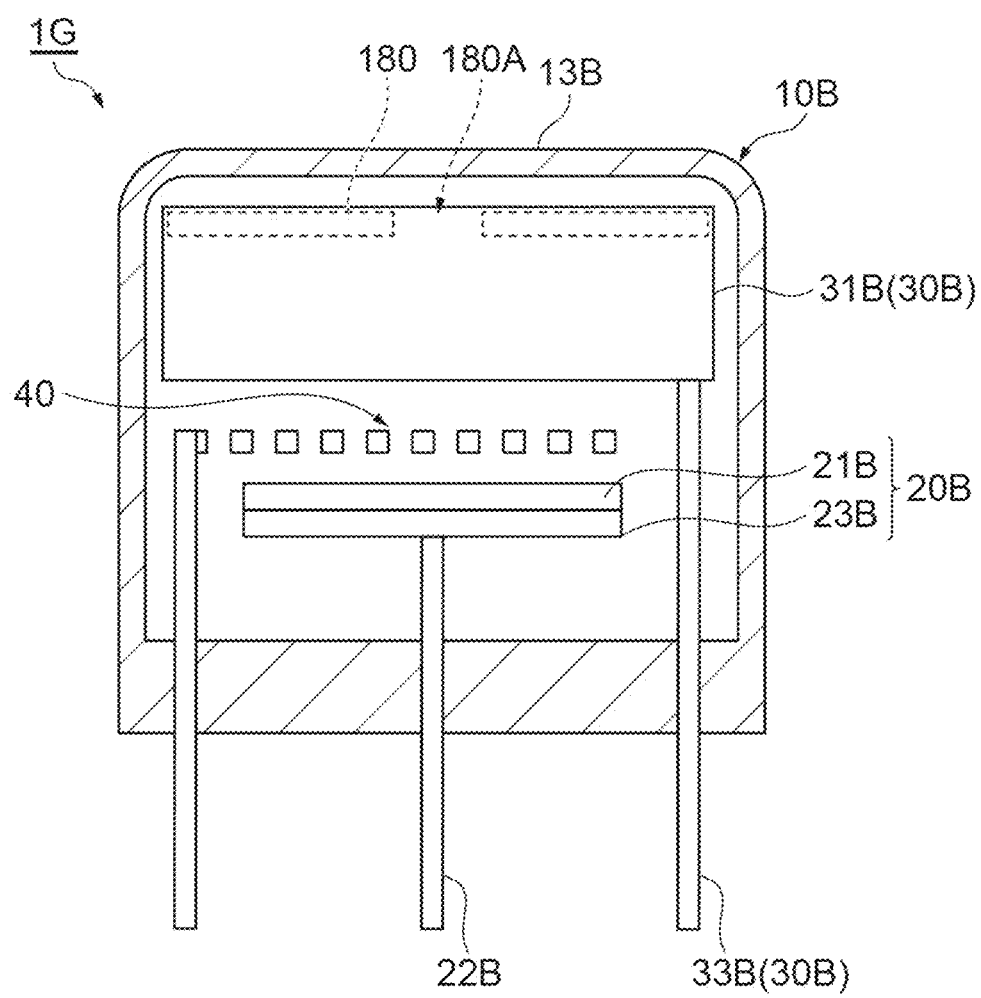
FIG. 11 is a cross-sectional view schematically showing a vacuum tube for amplifier circuit according to a modification example.

In addition, as a modification example of the form using the photoelectric conversion unit 20B having a reflection type photoelectric surface, a configuration shown in FIG. 11 may be adopted. A vacuum tube for amplifier circuit 1G shown in FIG. 11 has almost the same configuration as the vacuum tube for amplifier circuit 1B shown in FIG. 5, but includes an electrode 180, which is a light transmissive electrode having an aperture portion 180A, in addition to the configuration of the vacuum tube for amplifier circuit 1B.

The electrode 180 is a lid-shaped electrode provided on the end surface of an opening portion of a cylindrical anode 31B facing the light incidence window 13B, and forms a part of the anode 31B. As shown in FIG. 11, the electrode 180 has the aperture portion 180A formed on the signal light path so as not to interfere with the signal light. The entire electrode 180 may have a mesh shape, or only the aperture portion 180A may have a mesh shape. According to such a configuration, photoelectrons that have passed through the grid electrode 40 and travel in the direction of the light incidence window 13B (photoelectrons that cannot be appropriately collected by the anode 31B) can be effectively collected by the electrode 180.

Figure 12:
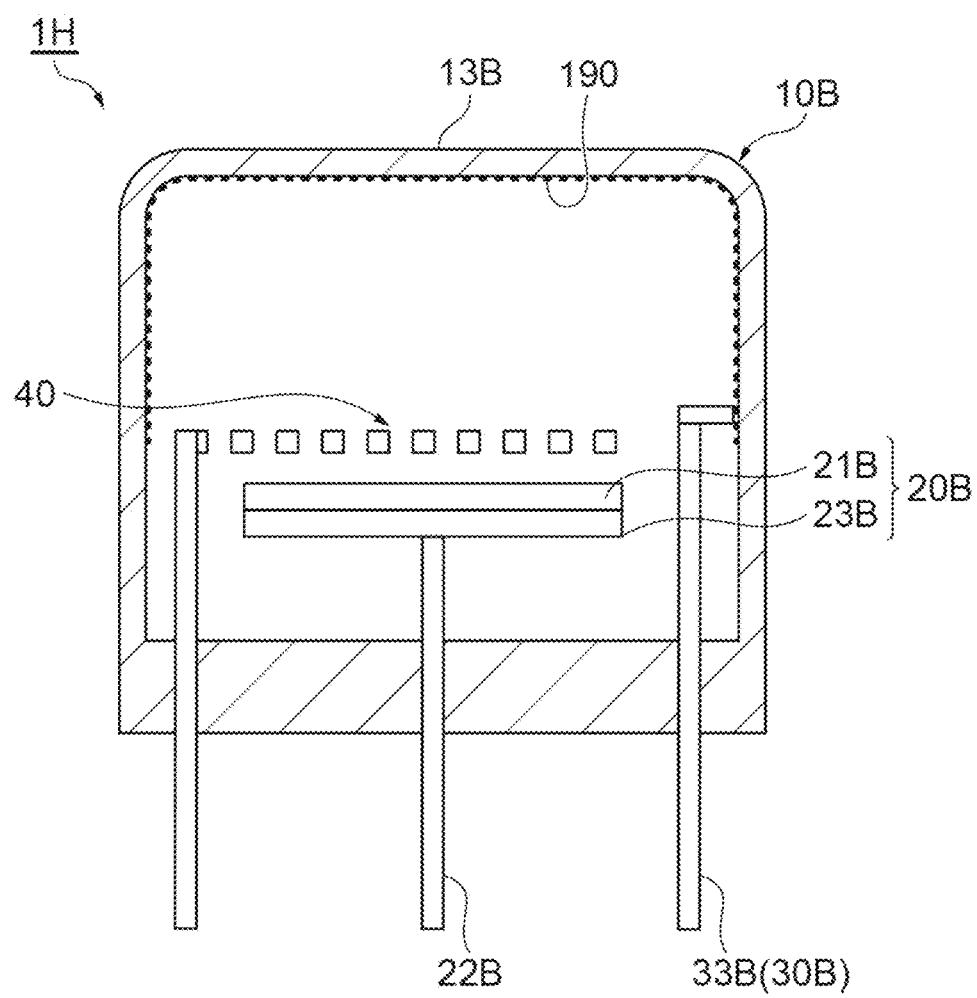
FIG. 12 is a cross-sectional view schematically showing a vacuum tube for amplifier circuit according to a modification example.

In addition, as a modification example of the form using the photoelectric conversion unit 20B having a reflection type photoelectric surface, a configuration shown in FIG. 12 may be adopted. A vacuum tube for amplifier circuit 1H shown in FIG. 12 has almost the same configuration as the vacuum tube for amplifier circuit 1B shown in FIG. 5, but includes a light transmissive electrode 190 instead of the anode 31B (refer to FIG. 5) in the vacuum tube for amplifier circuit 1B.

The light transmissive electrode 190 is a light transmissive electrode formed on the inner surface of the bulb 10B including the light incidence window 13B. The light transmissive electrode 190 is provided on the inner surfaces of the side wall and the upper wall of the bulb 10B on a side of the light incidence window 13B rather than the grid electrode 40, and it is preferable that the light transmissive electrode 190 is not provided at least on the wall surface of the bulb 10B on a side of the photoelectric conversion unit 20B rather than the grid electrode 40 so that the light transmissive electrode 190 is not affected by photoelectrons that do not pass through the grid electrode 40. The light transmissive electrode 190 is formed by, for example, a light transmissive conductive film formed of ITO, Cr, Al, or the like, or a mesh member. A current signal is output from the light transmissive electrode 190 through the stem pin 33B. In the light transmissive electrode 190, if only the central region serving as the path (optical path) of the signal light is light transmissive, the peripheral region (including a portion provided on the side wall of the bulb 10B) may have a light blocking property.

Figure 13:
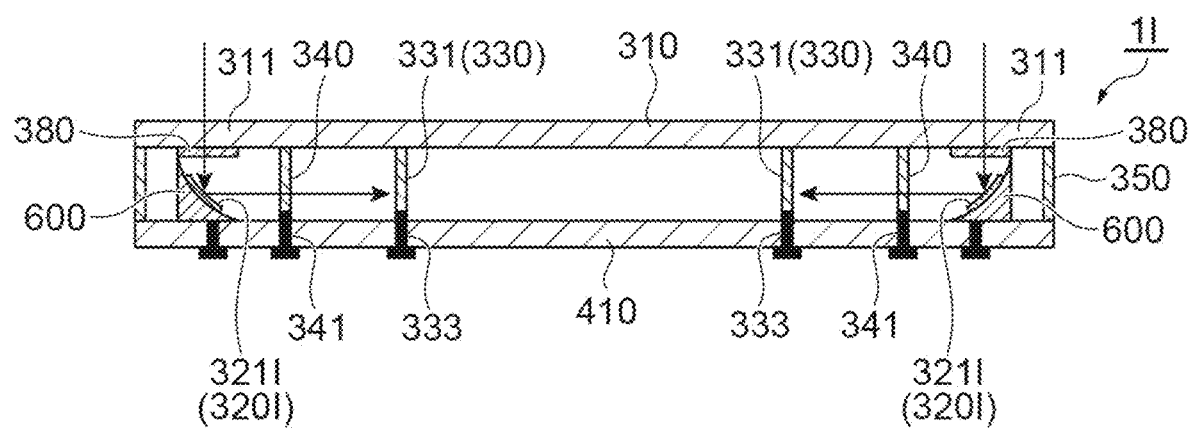
FIG. 13 is a cross-sectional view schematically showing a vacuum tube for amplifier circuit according to a modification example.

In addition, as a modification example of the form in which a vacuum tube is manufactured by using the semiconductor manufacturing technology, a configuration shown in FIG. 13 may be adopted. A vacuum tube for amplifier circuit 1I shown in FIG. 13 has almost the same configuration as the vacuum tube for amplifier circuit 1D shown in FIG. 7, but includes a photoelectric conversion unit 320I (photoelectric conversion unit having a reflection type photoelectric surface 321I) instead of the photoelectric conversion unit 320 (refer to FIG. 7(b)) and further includes a window side electrode 380.

The photoelectric conversion unit 320I converts light transmitted through the light incidence window 311 into photoelectrons. The photoelectric conversion unit 320I is provided on the substrate 410 so as to face the light incidence window 311, and has a pair of pedestal portions 600, each of which has a triangular cross section having an arc-shaped hypotenuse, and a pair of reflection type photoelectric surfaces 321I that emit converted photoelectrons. The photoelectric surface 321I is provided on the arc-shaped surface of the pedestal portion 600. As indicated by the arrows in FIG. 13, photoelectrons emitted from the photoelectric surface 321I pass through the grid electrode 340 and move toward the anode 331 in the central direction of the substrate 410.

The window side electrode 380 is a light transmissive conductive film formed on the inner surface of the light incidence window 311. The window side electrode 380 is formed by, for example, a light transmissive conductive film formed of ITO, Cr, Al, or the like, or a mesh member. The window side electrode 380 has a configuration capable of suppressing a situation in which photoelectrons emitted from the photoelectric surface 321I are incident on the light incidence window 311 to charge the light incidence window 311. The window side electrode 380 has the same potential as the photoelectric surface 321I by being physically connected to the photoelectric surface 321I or by establishing a separate electrical connection or supplying power thereto.

REFERENCE SIGNS LIST 1, 1B, 1C, 1D, 1E, 1F, 1G, 1H, 1I: vacuum tube for amplifier circuit, 10, 10B: bulb (vacuum housing), 13, 111, 311: light incidence window (incidence window portion), 20, 20B, 120, 320: photoelectric conversion unit, 21, 21B, 121, 321: photoelectric surface, 23B: cathode, 30, 30B, 130, 330: output unit, 31, 31B, 131, 331: anode, 40, 140, 340: grid electrode, 110, 210, 310, 410: substrate.

The invention claimed is:

1. A vacuum tube for amplifier circuit, the amplifier circuit configured to receive a signal input to generate an amplification signal, the vacuum tube comprising:

an incidence window portion configured to transmit signal light;

a photoelectric conversion unit configured to convert the signal light transmitted through the incidence window portion into photoelectrons;

an output unit configured to have an anode, on which the photoelectrons are incident, and output a signal associated with the amplification signal, and the signal corresponding to the photoelectrons incident on the anode; and a grid electrode configured to be disposed in a path of the photoelectrons from the photoelectric conversion unit to the anode and control an amount of the photoelectrons incident on the anode based on the signal input.

2. The vacuum tube for amplifier circuit according to claim 1, wherein a separation distance between a photoelectric surface of the photoelectric conversion unit and the grid electrode is shorter than a separation distance between the grid electrode and the anode.

3. The vacuum tube for amplifier circuit according to claim 1, wherein the photoelectric conversion unit has a transmission type photoelectric surface.

4. The vacuum tube for amplifier circuit according to claim 1, wherein the photoelectric conversion unit has a reflection type photoelectric surface.

5. The vacuum tube for amplifier circuit according to claim 4, further comprising:

a housing unit formed of a conductive material for fixing the incidence window portion; and a light transmissive electrode configured to be provided between the incidence window portion and the photoelectric conversion unit and be electrically connected to the housing unit, wherein the anode is formed by the housing unit and the light transmissive electrode.

6. The vacuum tube for amplifier circuit according to claim 5, wherein the light transmissive electrode is provided on the incidence window portion.

7. The vacuum tube for amplifier circuit according to claim 6, wherein the light transmissive electrode includes a light transmissive conductive film.

8. The vacuum tube for amplifier circuit according to claim 5, wherein the light transmissive electrode is provided so as to protrude from an inner wall of the housing unit, and has an aperture portion through which the signal light passes.

9. The vacuum tube for amplifier circuit according to claim 4, further comprising:

a light transmissive electrode provided between the incidence window portion and the photoelectric conversion unit, wherein the anode includes the light transmissive electrode.

10. The vacuum tube for amplifier circuit according to claim 4, further comprising:

a housing unit including the incidence window portion; and a light transmissive electrode provided on the housing unit including the incidence window portion, wherein the anode is formed by the light transmissive electrode.

11. The vacuum tube for amplifier circuit according to claim 1, further comprising:

a first substrate having the incidence window portion; and a second substrate facing the first substrate, wherein the photoelectric conversion unit is provided on the first substrate or the second substrate, and the anode and the grid electrode are provided so as to be erected between the first substrate and the second substrate.

12. The vacuum tube for amplifier circuit according to claim 11, wherein the photoelectric conversion unit has a pedestal portion provided on the second substrate so as to face the incidence window portion and a reflection type photoelectric surface provided on the pedestal portion, and a counter electrode having the same potential as the photoelectric surface is provided on the incidence window portion.

13. An amplifier circuit, comprising:

the vacuum tube for amplifier circuit according to claim 1;

a driving power supply unit for driving the vacuum tube for amplifier circuit;

a control signal output unit configured to output a control signal for controlling the amount of photoelectrons with respect to the grid electrode; and a signal light generation unit configured to generate signal light toward the incidence window portion.

14. The amplifier circuit according to claim 13, wherein the signal light generation unit includes a semiconductor light emitting element.

15. The amplifier circuit according to claim 14, wherein the signal light generation unit includes a monitor unit that monitors an amount of light of the semiconductor light emitting element, and the amount of light of the semiconductor light emitting element is controlled to be constant based on a signal from the monitor unit.

16. The amplifier circuit according to claim 13, further comprising:

a plurality of sets of the vacuum tube for amplifier circuit and the signal light generation unit, wherein light is blocked between adjacent sets of the vacuum tube for amplifier circuit and the signal light generation unit.

17. A vacuum tube for amplifier circuit, comprising:

an incidence window portion configured to transmit signal light;

a photoelectric conversion unit configured to convert the signal light transmitted through the incidence window portion into photoelectrons;

an output unit configured to have an anode, on which the photoelectrons are incident, and output a signal corresponding to the incident photoelectrons; and a grid electrode configured to be disposed in a path of the photoelectrons from the photoelectric conversion unit to the anode and control an amount of the photoelectrons incident on the anode, wherein a separation distance between a photoelectric surface of the photoelectric conversion unit and the grid electrode is shorter than a separation distance between the grid electrode and the anode, and the photoelectric surface and the grid electrode are disposed so as to face each other in parallel, and wherein the photoelectric conversion unit has a transmission type photoelectric surface.

18. A vacuum tube for amplifier circuit, comprising:
an incidence window portion configured to transmit signal light;
a photoelectric conversion unit configured to convert the signal light transmitted through the incidence window portion into photoelectrons, wherein the photoelectric conversion unit has a reflection type photoelectric surface;
an output unit configured to have an anode, on which the photoelectrons are incident, and output a signal corresponding to the incident photoelectrons;
a grid electrode configured to be disposed in a path of the photoelectrons from the photoelectric conversion unit to the anode and control an amount of the photoelectrons incident on the anode;
a housing unit formed of a conductive material for fixing the incidence window portion; and
a light transmissive electrode configured to be provided between the incidence window portion and the photoelectric conversion unit and be electrically connected to the housing unit,
wherein the anode is formed by the housing unit and the light transmissive electrode.

19. A vacuum tube for amplifier circuit, comprising:
an incidence window portion configured to transmit signal light;
a photoelectric conversion unit configured to convert the signal light transmitted through the incidence window portion into photoelectrons;
an output unit configured to have an anode, on which the photoelectrons are incident, and output a signal corresponding to the incident photoelectrons; and
a grid electrode configured to be disposed in a path of the photoelectrons from the photoelectric conversion unit to the anode and control an amount of the photoelectrons incident on the anode;
a first substrate having the incidence window portion; and
a second substrate facing the first substrate,
wherein the photoelectric conversion unit is provided on the first substrate or the second substrate, and
the anode and the grid electrode are provided so as to be erected between the first substrate and the second substrate.

* * * * *